United States Patent
Fleischer et al.

(10) Patent No.: US 12,328,468 B2
(45) Date of Patent: **\*Jun. 10, 2025**

(54) SYNCHRONIZATION WITH SYNTHESIZED AUDIO CLOCK

(71) Applicant: Roku, Inc., San Jose, CA (US)

(72) Inventors: Paul Fleischer, Aarhus V (DK); Brian Thoft Moth Moller, Aalborg SV (DK); Bjorn Reese, Aarhus V (DK)

(73) Assignee: Roku, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/415,349

(22) Filed: Jan. 17, 2024

(65) Prior Publication Data

US 2024/0155176 A1    May 9, 2024

Related U.S. Application Data

(63) Continuation of application No. 18/120,180, filed on Mar. 10, 2023, now abandoned, which is a continuation of application No. 17/212,178, filed on Mar. 25, 2021, now Pat. No. 11,627,365, which is a continuation of application No. 16/319,991, filed as application No. PCT/DK2016/050256 on Jul. 25, 2016, now Pat. No. 10,979,757.

(51) Int. Cl.
| | |
|---|---|
| *H04N 21/43* | (2011.01) |
| *H03L 7/00* | (2006.01) |
| *H04N 5/04* | (2006.01) |
| *H04N 21/4363* | (2011.01) |

(52) U.S. Cl.
CPC ......... *H04N 21/4305* (2013.01); *H03L 7/00* (2013.01); *H04N 5/04* (2013.01); *H04N 21/43076* (2020.08); *H04N 21/43637* (2013.01)

(58) Field of Classification Search
None
See application file for complete search history.

(56) References Cited

U.S. PATENT DOCUMENTS

| | | |
|---|---|---|
| 6,598,172 B1 | 7/2003 | VanDeusen et al. |
| 8,707,077 B2 | 4/2014 | Knowles |
| 11,627,365 B2 | 4/2023 | Fleischer et al. |
| 2005/0166079 A1 | 7/2005 | Lienhart et al. |

(Continued)

OTHER PUBLICATIONS

International Search Report and Written Opinion of the International Searching Authority directed to related International Patent Application No. PCT/DK2016/050256, mailed Oct. 14, 2016; 8 pages.

*Primary Examiner* — Jamaal Henson
(74) *Attorney, Agent, or Firm* — Sterne, Kessler, Goldstein & Fox P.L.L.C.

(57) ABSTRACT

The invention provides a method for providing a synchronization in a computer network for synchronized playback of audio an/or video by a plurality of separate devices. Each separate device generates a virtual clock in response to a timing of the audio codec of a received audio stream. Especially, segmented time is used as reference time. Either the virtual clock is generated directly in response to the tick counter of the audio codec, or by a periodic measurement of the timing of the audio codec extrapolated by a monotonic clock. A sample rate converter may be used to slightly adjust the frequency of the virtual clock.

20 Claims, 3 Drawing Sheets

(56) References Cited

U.S. PATENT DOCUMENTS

| | | |
|---|---|---|
| 2008/0271105 A1 | 10/2008 | Perry et al. |
| 2008/0291266 A1 | 11/2008 | Burckart et al. |
| 2009/0063419 A1 | 3/2009 | Nurminen et al. |
| 2009/0083372 A1* | 3/2009 | Teppler ............... H04L 9/3297 380/277 |
| 2009/0089842 A1 | 4/2009 | Perry et al. |
| 2009/0217329 A1 | 8/2009 | Riedl et al. |
| 2012/0169930 A1 | 7/2012 | Carter |
| 2013/0089026 A1* | 4/2013 | Piper ..................... H04R 5/04 370/328 |
| 2014/0013008 A1 | 1/2014 | Lazarus et al. |
| 2014/0181270 A1 | 6/2014 | Millington |
| 2015/0094834 A1* | 4/2015 | Vega ................. H04N 21/8547 700/94 |
| 2018/0262792 A1 | 9/2018 | Mackay et al. |
| 2019/0158564 A1 | 5/2019 | Wang et al. |
| 2019/0174445 A1 | 6/2019 | Itagaki et al. |
| 2019/0238925 A1 | 8/2019 | Fleischer et al. |
| 2021/0219010 A1 | 7/2021 | Fleischer et al. |
| 2023/0283830 A1 | 9/2023 | Fleischer et al. |

\* cited by examiner

SYNCHRONIZATION WITH SYNTHESIZED AUDIO CLOCK

RELATED APPLICATIONS

This application is a continuation of U.S. application Ser. No. 18/120,180, filed Mar. 10, 2023, which is a continuation of U.S. application Ser. No. 17/212,178, filed Mar. 25, 2021, which is a continuation of U.S. application Ser. No. 16/319,991, filed Jan. 23, 2019, which claims priority to International Patent Application No. PCT/DK2016/050256, filed Jul. 25, 2016, all of which are incorporated by reference herein in their entireties.

FIELD OF THE INVENTION

The present invention relates to the field of synchronized playback of audio or video between devices in a peer-to-peer computer network system, e.g. in a wi-fi network.

BACKGROUND OF THE INVENTION

In synchronized playback of audio or video between a plurality of devices in a peer-to-peer computer network system, the devices can participate in coordinated sessions, where the participating devices can play synchronously. The participating devices can be located within or across several rooms.

In order to play synchronously, the participating devices need to agree on the playback time and pace. One of the key parameters of providing precise audio playback synchronization is the ability to share the same time between multiple devices in a network.

Solutions exist that have various means to achieve synchronized audio playback. Some of these systems use the system clock, others provide a hardware solution requiring each of the nodes in the network to run with dedicated hardware. Even when working without adjusting the system clocks as provided by the operating system, these solutions often construct clocks that are derived from the system clock, adjusted with a frequency and offset component to match some remote system. However, such synchronization is in general not accurate.

SUMMARY OF THE INVENTION

Thus, according to the above description, it is an object of the present invention to provide an accurate way of providing synchronized playback of audio and/or video in a computer network of a plurality of devices.

In a first aspect, the invention provides a method for synchronizing playback of audio and/or video from a source in computer network of a plurality of separate devices in a computer network session, see appended claim 1.

This invention describes a virtual clock, which allows time synchronization between audio/video devices in a peer-to-peer network audio playback system without requiring the primary system clocks being synchronized, while also avoiding long-term dependency on accuracy of such clocks.

Besides easing the integration of audio synchronization systems, this allows for a more direct synchronization between the audio clocks, ultimately resulting in a better synchronization.

According to this invention, multiple devices can play the same audio or video experience in a synchronized manner across a computer network, without requiring specialized hardware or system clock adjustments.

By working closely with the clocking system that controls the audio playback, a more accurate synchronization can be made than when synchronizing system clocks and adjusting playback according to the system clocks.

In the dependent claims, a number of embodiments and/or preferred features will be defined.

In a second aspect, the invention provides a protocol for controlling a plurality of separate devices in a computer network.

In a third aspect, the invention provides a computer executable program code, or a programmable- or fixed hardware, and/or combination hereof, arranged to perform the method according to the first aspect, or causes a device with a processor to function according to the protocol of the second aspect. The computer executable program code may be stored on a data carrier. The program code may be implemented to function on any type of processor platform.

In a fourth aspect, the invention provides a device that operates according to the method or protocol of the first or second aspect. Especially, the device may be an audio device, such as a stand alone active loudspeaker. The device may also be any other type of device with audio and/or video capabilities, e.g. a TV set.

In a fifth aspect, the invention provides a system of a plurality of devices according to the fourth aspect, e.g. mixed types of devices arranged to take part in a computer network session, e.g. a wi-fi network session, of synchronized playback of audio and/or video content.

In a sixth aspect, the invention provides an electronic chip programmed to allow a device to operate according to protocol according to the third aspect, if provided with access to the electronic chip, e.g. if the device has the chip installed therein.

It is appreciated that the same advantages and embodiments described for the first aspect apply as well for the second, third, fourth, fifth, and sixth aspects. Further, it is appreciated that the described embodiments can be intermixed in any way between all the mentioned aspects.

BRIEF DESCRIPTION OF THE FIGURES

The invention will now be described in more detail with regard to the accompanying figures of which

The figures illustrate specific ways of implementing the present invention and are not to be construed as being limiting to other possible embodiments falling within the scope of the attached claim set.

DETAILED DESCRIPTION OF THE INVENTION

Figure 1:
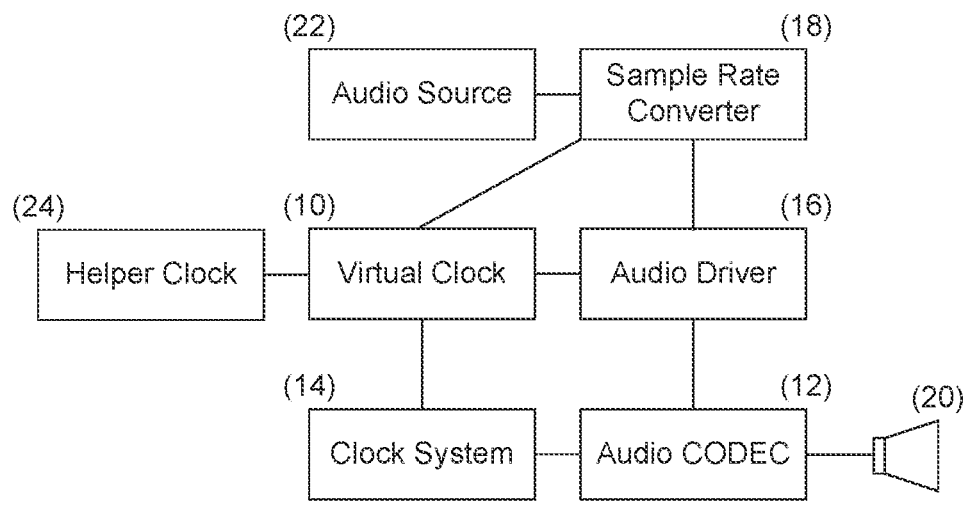
FIG. 1 illustrates one embodiment of a virtual clock (10) based on an Audio CODEC (12), with the possibility of fine tuning.

FIG. 1 illustrates an audio pipeline, where an audio source (22) delivers its audio data to the audio driver (16) with an intermediate sample rate converter (18). The Audio CODEC (12) is driven by a clock system (14), and produces an audio signal (digital or analog) which is passed on to downstream elements (20), such as a loudspeaker or an amplifier.

The virtual clock (10) can be driven by the clock system (14) or the audio driver (16), depending on the hardware and operating system configuration. The helper clock (24) may be needed, if the clock system (14) does not provide a tick counter. The Sample rate converter (18) is used to adjust the playback rate, in case the clock system (14) frequency cannot be fine-tuned.

Defining a virtual clock (10), which is driven by the audio codec (12) of an audio device, allows reasoning about time in the domain of the audio device. By allowing the playback time to be read and adjusted with minimal involvement of other clocks or timing sources, the virtual clock maintains a close relationship with the audio codec timing of a single sample. This is preferred to allow high quality synchronization between multiple devices across a computer network.

In order to be independent of the audio driver architecture, the virtual clock can be implemented in at least the two preferred ways: One utilizing direct access to the tick counter of clock system of the audio codec, and one making periodic measurements and extrapolating between these measurements.

For systems that allow access to the tick counter of the clock system (14), which drives the audio codec (12), the tick counter will be used as the primary timing information. Reading the value of the virtual clock will therefore return the tick counter value. However, in order to deal with overflows of the tick counter, a value internal to the virtual clock is added, as will be described shortly.

In systems, where the tick counter of the clock system driving the audio codec cannot be accessed, the virtual clock is controlled by either a) keeping track of the pace at which samples are consumed by the audio driver (16), or, b) interrupts at regular intervals generated by the clock system (14).

Figure 2:
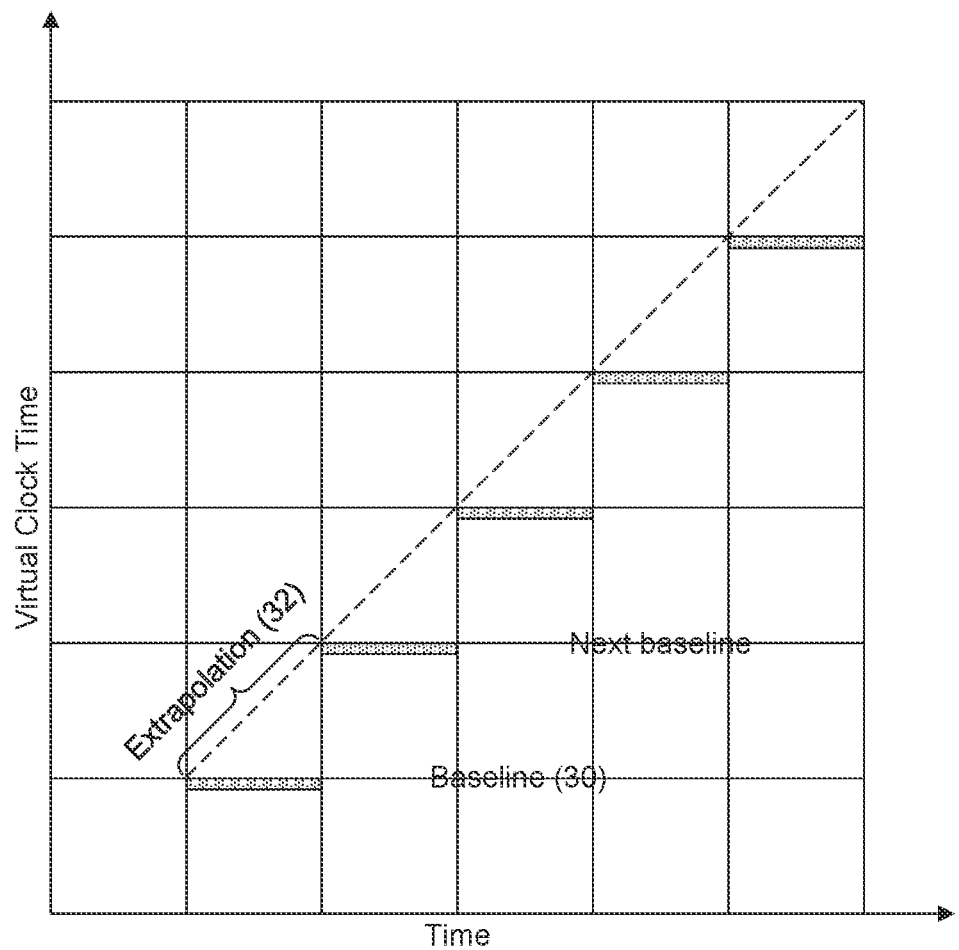
FIG. 2 shows discrete updates of the virtual clock in terms of measurement points (30), and how time is extrapolated between them (32)

FIG. 2 shows discrete updates of the virtual clock in terms of measurement points serving as intermediary baseline times (30), and how time is extrapolated between them (32). In general, this yields regular baseline times (30). The rate of these are either equal to the number of write interactions with the audio driver, or with the rate of interrupts generated by the clock system (14). In order to allow the virtual clock to have a resolution higher than this rate, a monotonic helper clock (24) is used to extrapolate time (32) between the baseline times (30) that these updates constitute. An example of such a monotonic clock is the monotonic system clock. In such synthesized audio clock systems, the two clocks can have different quality characteristics. The audio driver (16) typically has a high accuracy (low deviation from the real playback time), but is slow to obtain due to blocking on I/O or multi-threading primitives. The helper clock (24) is typically instantaneous to obtain, but may have a lower accuracy.

In the synthesized audio clock system, the accuracy of the virtual clock (10) depends mainly on the rate at which the audio driver (16) updates the baseline time. The accuracy of the helper clock (24) extrapolation depends partly on the tick frequency of the helper clock (24) compared to the tick frequency of the audio driver (16), and partly on asynchronous sample rate conversion which alters the tick frequency of the audio driver (16).

In order to ensure that the frequency of the virtual clock follows that of the audio codec, a frequency adjustment is made when interpolating as to match the audio codec's frequency, as measured between the baseline updates. The frequency of audio driver interaction or the frequency of the interrupt is kept high enough such that the period where extrapolations occurs is short. Each update (interrupt or driver interaction) will correct any drift introduced by the monotonic helper clock. This keeps the cumulative extrapolation error within bounds.

The helper clock (24) extrapolation is calculated as the time passed between the most recent update of the baseline time, and the time at which the virtual clock (10) is read. The audio driver (16) and the helper clock (24) may be driven by different hardware clock oscillators so they may tick at different clock frequencies, and this must be compensated for by multiplying the extrapolation with a scalar such that the extrapolation is done using the audio driver (16) clock ticks. The scalar is calculated by dividing the audio driver (16) clock frequency by the helper clock (25) frequency. This scalar is normally calculated on-the-fly so it can account for other factors that influence the clock frequencies such as temperature or ageing. The easiest way to estimate the scalar is to use two consecutive measurements and divide the difference in the audio driver (16) clock by the difference in the helper clock (24). In practice, such an estimate will be prone to measurement jitter, which can be smoothed over by collecting statistics, such as using a running average of scalar estimates collected over several time intervals.

In order to allow a virtual clock to be synchronized with one or more other virtual clocks on other devices in an audio network system, it must be possible to adjust the frequency of the virtual clock (and thus the audio codec's playback rate) ever so slightly, as large or abrupt adjustments are perceptible to the human ear. For systems that allow direct control with the clock system (14) of the audio codec (12), this adjustment can be made directly. For systems where this is not possible, a sample rate converter (18) may be used to slightly lengthen or shorten playback time of the audio.

The baseline time of the virtual clock may be calculated by counting the number of samples output by the audio CODEC (12). However, this method can create synchronization jitter. Modifying the playback rate means that the audio CODEC (12) will output fewer or more samples than the number of input samples passed from the audio source (22). As each device in an audio network system will apply its own sample rate conversion in order to synchronize its own audio playback to the audio playback of the other devices, their virtual clocks may run at different speeds even though they consume the same number of input samples. So, even if the devices are perfectly synchronized, their virtual clock can mislead them into making unnecessary synchronization adjustments.

Preferably, the baseline time of the virtual clock is calculated by counting how many input samples from the audio source (22) has been consumed. This must be done indirectly by counting the number of samples output by the audio CODEC (12), and then adjust this number by the playback rate to reproduce the number of input samples consumed. As the playback rate may be modified during playback, the virtual clock must keep track of the playback rates of each sample currently being processed by the audio CODEC (12). In practice, the playback rate is not modified per sample, so the virtual clock can instead keep track of the playback rates of sequences of samples. This makes the virtual clock invulnerable to the problem of unnecessary synchronization adjustments of the virtual clock that simply counts output samples.

In case the sample rate converter (18) is used to modify the playback time, the asynchronous sample rate conversion is another source of error on the helper clock (24) extrapolation. This can be compensated for by adjusting the extrapolation by the playback rate. In case the playback rate is modified multiple times between two updates of the baseline time, the extrapolation must use different playback rates for different time intervals.

Figure 4:
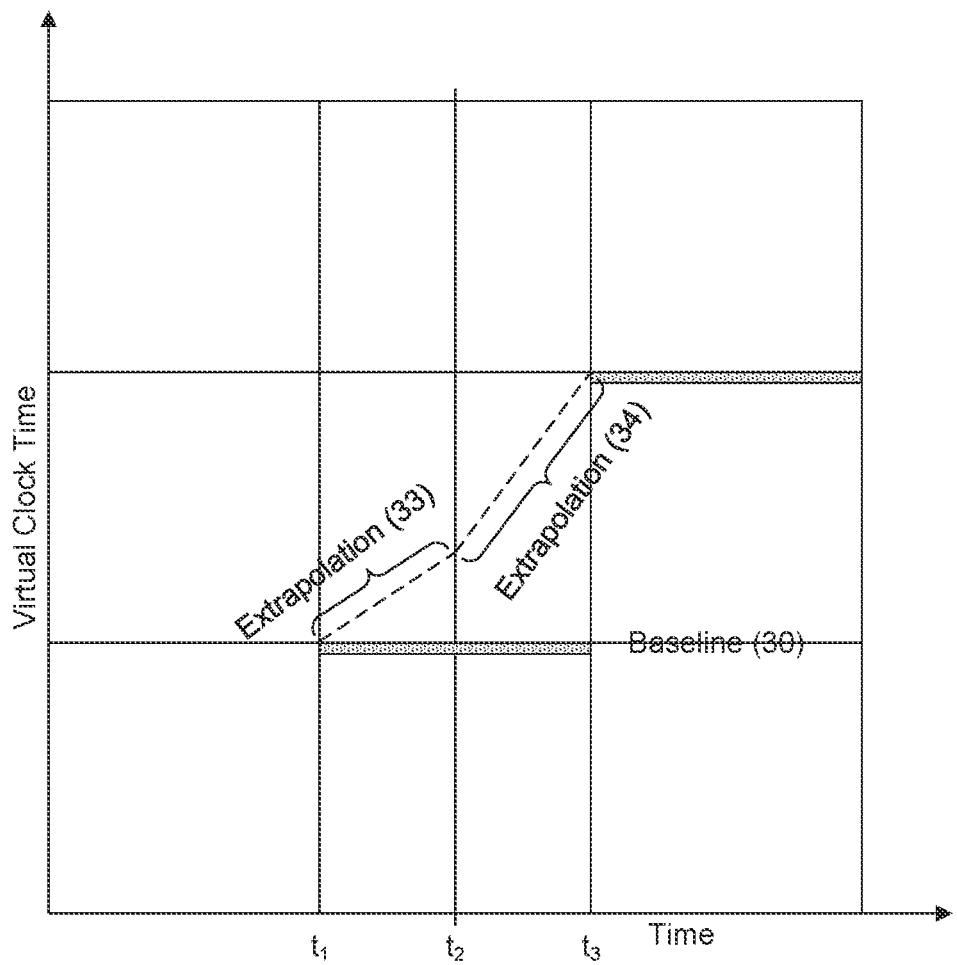
FIG. 4 shows different extrapolations (33 and 34) within a single discrete update of the virtual clock (30).

FIG. 4 illustrates, as an example, if the baseline time (30) is updated at time $t_1$ with the playback rate $S_a$, and another playback rate $S_b$ is applied from time $t_2$ until the next update of the baseline time at time $t_3$, then the extrapolation must use playback rate $S_a$ in the time interval from $t_1$ to $t_2$ (33) and playback rate $S_b$ in the time interval $t_2$ to $t_3$ (34).

In order to allow the virtual clock to be used to synchronize playback within the audio network, it should preferably be monotonic. When a tick counter is provided by the clock system (14), the absolute value of the virtual clock is a sum of the tick counter and an offset internal to the virtual clock. When the tick counter of the underlying clock shows non-monotonic behavior, the virtual clock compensates for this by increasing its internal offset. If no tick counter is provided, the virtual clock's internal offset is increased on each timer update, be it driven by an interrupt or an audio driver interaction. If the extrapolation between two updates results in non-monotonic behavior, the virtual clock compensates by temporarily increasing the internal offset, and adjusting the frequency used for extrapolations until next update. This ensures monotonicity of the virtual clock, regardless of the physical clock or audio driver behavior.

Using the virtual clock to synchronize events requires the virtual clock to be running at all times. However, being dependent on the audio codec's clocking, audio needs to pass through the audio pipeline in order for the virtual clock to be running. This can be achieved by playing zeros: There is no audio, but the entire audio pipeline is kept running, and timing is maintained.

Synchronizing across networked devices requires a common reference of the timing information, which means a common time origin, also known as an epoch, and a common time step. A global clock may serve as the reference time, e.g. a global clock may be the wall time, also known as the system time, which has an epoch at midnight on Jan. 1, 1970. The disadvantages of using the system time is that it may not provide the necessary timing accuracy for synchronized audio playback, and the system time may be modified by other services such as the Network Time Protocol making time difference calculations unreliable. Another example is of a global clock is the IEEE 802.11 Time Synchronization Function, which has a higher accuracy, but is only available to devices on the same Access Point. Still further, the audio clock may be used as the reference time. Audio clocks do not normally have a predetermined epoch, so this has to be agreed by participating devices. This can be done by choosing a global clock to establish the epoch, or to let the participating devices negotiate an arbitrary epoch.

In a preferred method, a segmented time is used as the reference time. Segmented time has a sequence of time intervals, where each time interval has its own local epoch and a monotonic segment number to differentiate two distinct time intervals from each other. Segmented time is monotonic because time points in different time intervals are comparable due to the segment number. While segmented time is comparable, time differences can only be calculated if both time points are within the same time interval. An example of a segmented time is to use a 2-tuple with a segment number and the audio presentation time. The audio presentation time uses the start of the audio playback, such as the beginning of a music track, as the epoch. This is a natural choice as networked audio synchronization is about aligning the audio presentation time on different network devices.

The segment number is preferably updated whenever an abrupt change in the audio presentation time happens. This can happen when playing the next music track in a playlist, or when seeking within a music track.

Another example of a segmented time is to use a 3-tuple with a segment number, the audio presentation time, and an idle time. The idle time is useful for situations where the audio system has to insert audio samples that are not present in the audio source, such as inserting samples with value zero to play silence when an audio playback is paused.

Figure 3:
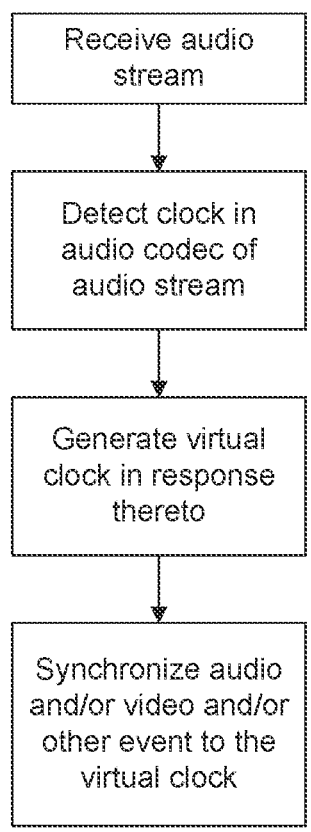
FIG. 3 illustrates steps of a virtual clock synchronization scheme embodiment.

FIG. 3 shows an example of steps of a synchronization scheme embodiment, where a virtual clock is generated in response to the incoming audio stream, and wherein the virtual clock is used to synchronize playback of audio and/or video, and/or another event.

To sum up: the invention provides a method for providing a synchronization in a computer network for synchronized playback of audio an/or video by a plurality of separate devices. Each separate device generates a virtual clock in response to a timing of the audio codec of a received audio stream. Especially, segmented time is used as reference time. Either the virtual clock is generated directly in response to the tick counter of the audio codec, or by a periodic measurement of the timing of the audio codec extrapolated by a monotonic clock. A sample rate converter may be used to slightly adjust the frequency of the virtual clock.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

What is claimed is:

1. A device, comprising:
   an audio driver configured to receive streamed data from a source device;
   a codec coupled to the audio driver and a clock system and configured to produce a signal for playing the streamed data provided by the audio driver that is received from the source device;
   the clock system coupled to the codec and configured to drive operations of the codec; and
   a virtual clock generator coupled to the clock system and the audio driver and configured to generate a virtual clock to facilitate time synchronization between the device and one or more other devices in a peer-to-peer network playback system for playing the streamed data without a system clock of the device and another system clock of another device of the peer-to-peer network playback system being synchronized, wherein the audio driver is further configured to receive an audio stream of zeros representing silence to provide a reference of timing to generate the virtual clock.

2. The device of claim 1, wherein the virtual clock is generated based on a tick counter of the clock system.

3. The device of claim 2, wherein the virtual clock is generated based on the tick counter of the clock system and an internal offset of the virtual clock generator.

4. The device of claim 3, wherein the virtual clock is a monotonic clock generated based on the tick counter of the clock system and the internal offset of the virtual clock generator.

5. The device of claim 1, wherein the device is a first device, the clock system is a first clock system, the virtual clock is a first virtual clock, and the peer-to-peer network playback system includes a second device having a second virtual clock, and wherein the first virtual clock is synchronized with the second virtual clock by adjusting a frequency of the first virtual clock.

6. The device of claim 5, wherein the first virtual clock is generated based on a tick counter of the first clock system, and the adjusting the frequency of the first virtual clock is performed by adjusting the tick counter of the first clock system.

7. The device of claim 1, wherein the virtual clock is generated by extrapolating periodic measurements of the clock system, and the device further comprises a sample rate converter coupled to the virtual clock generator and the audio driver of the device and configured to adjust the virtual clock.

8. The device of claim 1, wherein the streamed data includes audio data, and the device further comprises a speaker coupled to the codec to playback the streamed data received from the source device.

9. The device of claim 1, wherein the streamed data includes video data, and the device further comprises a display coupled to the codec to playback the video data.

10. The device of claim 1, wherein the clock system is different from a monotonic system clock of the device.

11. The device of claim 1, wherein the time synchronization between the device and the one or more other devices of the peer-to-peer network playback system is based on the virtual clock and a reference time obtained based on a segmented time including a sequence of two or more time intervals, wherein each time interval of the two or more time intervals has its own local epoch and a monotonic segment number to differentiate two time intervals from each other.

12. The device of claim 1, further comprising:
a monotonic helper clock coupled to the virtual clock generator and configured to generate the virtual clock by extrapolating periodic measurements of the clock system.

13. The device of claim 12, wherein the periodic measurements of the clock system includes a baseline time of the virtual clock calculated by counting a number of samples output by the codec.

14. A computer-implemented method performed by a device for synchronizing content playback for content received from a source device of a peer-to-peer network playback system, comprising:
receiving, by an audio driver of the device, streamed data from the source device via the peer-to-peer network playback system;
producing, by a codec of the device, a signal playing the streamed data provided by the audio driver that is received from the source device, wherein operations of the codec are driven by a clock system; and
generating a virtual clock, based on the clock system driving the operations of the codec, to facilitate time synchronization between the device and one or more other devices of the peer-to-peer network playback system for playing the streamed data without a system clock of the device and another system clock of another device of the peer-to-peer network playback system being synchronized, wherein the audio driver is further receives an audio stream of zeros representing silence to provide a reference of timing to generate the virtual clock.

15. The computer-implemented method of claim 14, wherein the device is a first device, the clock system is a first clock system, the virtual clock is a first virtual clock, and the peer-to-peer network playback system includes a second device having a second virtual clock, and wherein the method further comprises:
synchronizing the first virtual clock with the second virtual clock by adjusting a frequency of the first virtual clock.

16. The computer-implemented method of claim 14, wherein the generating the virtual clock comprises generating the virtual clock based on a tick counter of the clock system.

17. A device, comprising:
a network interface arranged to receive streamed data from a source device of a peer-to-peer network playback system;
an audio driver coupled to the network interface and configured to receive the streamed data;
a codec coupled to the audio driver and a clock system and configured to produce a signal for playing the streamed data;
the clock system coupled to the codec and configured to drive operations of the codec; and
a virtual clock generator coupled to the clock system and the audio driver and configured to generate a virtual clock to facilitate time synchronization between the device and one or more other devices in the peer-to-peer network playback system for playing the streamed data without a system clock of the device and another system clock of another device of the peer-to-peer network playback system being synchronized, wherein the audio driver is further configured to receive an audio stream of zeros representing silence to provide a reference of timing to generate the virtual clock.

18. The device of claim 17, wherein the streamed data includes audio data, and the device includes an audio device arranged to receive the streamed audio data via the network interface and playback an acoustic signal generated by the codec based on the streamed audio data.

19. The device of claim 17, wherein the streamed data includes video data, and the device includes a video device arranged to receive the streamed video data via the network interface and display a video signal generated by the codec based on the streamed video data.

20. The device of claim 17, wherein the clock system is different from a monotonic system clock of the device.

* * * * *